(12) United States Patent
Deboy et al.

(10) Patent No.: US 6,479,876 B1
(45) Date of Patent: Nov. 12, 2002

(54) VERTICAL POWER MOSFET

(76) Inventors: Gerald Deboy, Hauptstr. 10, D-82008 Unterhaching (DE); Jenoe Tihanyi, Isarweg 13, D-8551 Kirchheim (DE)

(*) Notice: Subject to any disclaimer, the term of this patent is extended or adjusted under 35 U.S.C. 154(b) by 0 days.

(21) Appl. No.: 09/462,759
(22) PCT Filed: Jul. 17, 1998
(86) PCT No.: PCT/DE98/02020
§ 371 (c)(1),
(2), (4) Date: Oct. 12, 2000
(87) PCT Pub. No.: WO99/04437
PCT Pub. Date: Jan. 28, 1999

(30) Foreign Application Priority Data

Jul. 17, 1997 (DE) .......................... 197 30 759

(51) Int. Cl.[7] ................. H01L 29/76; H01L 31/062
(52) U.S. Cl. .................... 257/401; 257/341; 257/392; 257/500
(58) Field of Search ............... 257/302, 392, 257/401, 499, 500, 138–139, 147–149, 355; 438/242

(56) References Cited

U.S. PATENT DOCUMENTS

| 4,742,382 A | * 5/1988 | Jaecklin | 357/39 |
| 5,216,275 A | 6/1993 | Chen | 257/493 |
| 5,438,215 A | * 8/1995 | Tihanyi | 257/401 |
| 5,525,826 A | * 6/1996 | Palara | 257/378 |

FOREIGN PATENT DOCUMENTS

| DE | 4309764 | 3/1993 |
| EP | 0071916 | 7/1982 |
| GB | 2243952 | 11/1991 |

* cited by examiner

Primary Examiner—Olik Chaudhuri
Assistant Examiner—DiLinh Nguyen
(74) Attorney, Agent, or Firm—Irwin Ostroff

(57) ABSTRACT

The invention relates to a vertical power MOSFET having additional column-like zones (11, 12) which are arranged in an inner zone (1) and have the same and the opposite conductivity type as/to the inner zone (1). The charge carrier life is reduced in the additional zones (12), which are of the same conductivity type as the inner zone (1), and the inner zone (1) is dimensioned such that the space charge zone does not reach the junction between the inner zone and a drain zone.

6 Claims, 2 Drawing Sheets

VERTICAL POWER MOSFET

BACKGROUND OF THE INVENTION

The invention relates to a vertical power MOSFET having a semiconductor body with an inner zone of the first conduction type and a predetermined doping concentration, having at least one base zone, adjoining the inner zone and a first surface of the semiconductor body, of the second conduction type and into which in each case at least one source zone is embedded, having at least one drain zone, adjoining one of the surfaces of the semiconductor body, with additional zones which are arranged in the inner zone essentially inside the space charge zone, which spreads out when there is a reverse voltage, and are of the second conduction type, having at least one additional zone, of the first conduction type, which is situated between these additional zones and is more highly doped than the inner zone, and having a doping level for the additional zones and having distances between the additional zones of the second conduction type such that their charge carriers are substantially depleted when a reverse voltage is applied.

Such a vertical power MOSFET is described in DE 43 09 764 C2, for example.

This known vertical power MOSFET, which is illustrated in section in the appended FIG. 3, has an inner zone 1 with a low level of n doping. The upper surface 2 of a semiconductor body incorporates base zones 3 of the p conduction type. The base zones 3 have source zones 4 of the n+ conduction type embedded in them. A gate electrode 8 is provided in insulated fashion above the surface 2. A highly doped drain zone 7 of the same conduction type as the inner zone 1 is arranged on the other surface 6.

The inner zone 1 is provided with additional semiconductor zones 11, 12 in the region of the space charge zone, which spreads out when there is a reverse voltage. There are at least two zones 11 of the opposite conduction type to the inner zone 1. The zones 11 have additional zones 12 arranged between them which are more highly doped than the inner zone and are of the n conduction type, which is the same as the inner zone 1. The zones 11, 12 are of column-shaped design. The additional zones 11 of the opposite conduction type can also be arranged in rod form. They are then surrounded on all sides by a single zone 12. Just like the zones 12, this single zone is of the same conduction type as the inner zone 1, but has a higher doping level.

If a forward voltage is applied to the power MOSFET shown in FIG. 3, then the said MOSFET can be turned on via the gate electrode 8. In this case, the electrons coming from a source zone 4 find a high doping level awaiting them in the additional zones 12. Hence, the bulk resistance of the power MOSFET is lowered.

If a reverse voltage is applied to the power MOSFET, then, starting from the pn junction-between the inner zone 1 and the base zone 3, a space charge zone forms whose extent increases as the reverse voltage rises. If the space charge zone runs into the p-doped zones 11, then these are conductively connected to the base zones 3 via the depleted area of the inner zone 1. A high-resistance connection is not inherently desirable on account of the dynamic properties. If the reverse voltage rises further, the space charge zone extends further, so that some of the charge carriers are also depleted from the zones 11 and 12. This is shown schematically by means of a dashed line 13.

If the reverse voltage rises further, the charge carriers are then depleted entirely from a large part of the inner zone 1 and from the zones 11, 12. In the inner zone 1., the space charge zone thus assumes a profile bounded by a dashed line 14. Hence, with the maximum reverse voltage applied, the additional zones 11, 12 are situated entirely in the space charge zone.

Depleting the charge carriers has the same effect as if the zones 11 and 12 were not present. Hence, with the space charge zone at its maximum extent, only the doping of the inner zone 1 matters, to a first approximation. If the degree of compensation, that is to say the overall balance of the sum of the charges in the zones 11 ("p columns") and of the sum of the charges in the zones 12 ("n columns") as well as of the surrounding regions, is selected low enough, then it is a simple matter to block 1000 V and more using this component. In the forward case, on the other hand, this power MOSFET has a resistance corresponding to that of a MOSFET, which turns off at a considerably lower level. The turn-off behaviour is determined by the "level" of the zones 11, 12 and the degree of compensation.

The bulk resistance can be varied by choice of the distance a of the zones 11, 12 from the first surface 2. It can also be influenced by the doping of the zones 12.

In this known MOSFET, the doping and the thickness of the zones 11, 12 are set such that the charge carriers are depleted entirely from these zones 11, 12 when the maximum reverse voltage is applied.

Vertical MOSFETs, which are used in power electronics, inherently afford the possibility, in contrast to other transistor designs such as a bipolar transistor having an insulated gate (IGBT), of using the inverse diode formed by an $n^+$ drain, an $n^-$ such as are provided by layers 7, inner zone 1, and base zone 3 epitaxial layer and a p well a freewheeling diode. Such freewheeling diodes are required, in particular, in pulse-controlled invertor applications, such as switched-mode power supplies and half bridges or full bridges for motor control.

With the FREDFET (Fast Recovery Epitaxial Diode FET), there is currently a component whose inverse diode can be used specifically as a freewheeling diode. The reverse recovery behaviour is not optimal, however, with respect to the desired transistor properties with current chopping, level and waveform of the reverse-current surge.

If customary MOSFETs are used, then external circuitry with a dedicated freewheeling diode and a further zener diode between the drain and the source is always necessary to protect the MOSFET from a breakdown. Even the power MOSFET disclosed in DE 43 09 764 C2 and explained above with reference to FIG. 3 is not satisfactory in terms of the properties of its inverse diode.

It is therefore the object of the present invention to provide a vertical power MOSFET which is improved in terms of the properties of its inverse diode without impairment of the transistor properties, particularly of the specific resistance between the drain and the source.

SUMMARY OF THE INVENTION the invention achieves this object with a vertical power mosfet of the type mentioned in the introduction in which the charge carrier life is reduced at least in the additional zones of the first conduction type, and in that the thickness dimensions of the additional zones are chosen such that the space charge zone, which spreads out when there is a reverse voltage, in practice does not infringe the junction, remote from the first surface of the semiconductor body, between the additional zones of the first conduction type and the drain zone.

In this instance, the invention is based on the knowledge that the doping concentration of the additional zones of the same conduction type as the inner zone is, on average, around an order of magnitude greater than the doping concentration of the substrate, which receives the same reverse voltage and is n doped, for example. Hence, the charge carrier life can be shortened by diffusion of platinum, gold etc. or by irradiation with electrons or helium, by at least the same amount more before negative repercussions on the specific resistance of the MOSFET materialize as a of the compensating effect of matching the life of the charge carriers to the doping of the current-carrying areas.

It is thus possible to attain a substantially shorter life for the charge carriers, with desirable values for this life being below 0.5 $\mu$s. This shorter life means that the current is turned off more quickly, so that the MOSFET can receive its reverse voltage sooner. Hence, the storage charge and the load on the MOSFET which is turning on are lowered accordingly in a full-bridge or half-bridge configuration.

The thickness dimensions of the additional zones forming an active layer are chosen optimally such that, at full reverse voltage, the space charge zone does not reach the. (rear) $n^-/n^+$ junction, which is remote from. the first surface of the semiconductor body, between the inner zone and the drain zone in any case. For this, a thickness of below about 10 pm for a reverse voltage of 400 V may be mentioned by way of example.

Since the current therefore flows essentially within relatively highly doped path areas, the loss of specific drain/source resistance is very low. In addition, the storage charge in the "rear" region of the MOSFET is retained. This storage charge is reduced by recombination and diffusion within about 0.5 is, so that it is possible to achieve a "smooth" waveform for the reverse-current surge, a so-called "soft recovery response". In particular, it is also possible to prevent the reverse current from chopping, which otherwise occurs with every MOSFET having a minimal thickness design. Overvoltages occurring as a result of stray inductances in the path between a commutating MOSFET and one that is turning on, up until the commutating switch undergoes avalanche breakdown, and the associated power-supply loads, are thus reliably prevented.

Hence, the vertical power MOSFET according to the invention can be used as a freewheeling diode. This means that, in contrast to the prior art, appropriate replacement circuitry is no longer necessary with a dedicated freewheeling diode.

BRIEF DESCRIPTION OF THE DRAWINGS

The invention is explained in more detail below with the aid of the drawings, in which:

FIG. 3 has already been described in detail in the introduction.

In FIG. 1, the same reference symbols as in FIG. 3 are used for mutually corresponding components, so that there is no need for any more detailed explanation in this regard.

Figure 1:
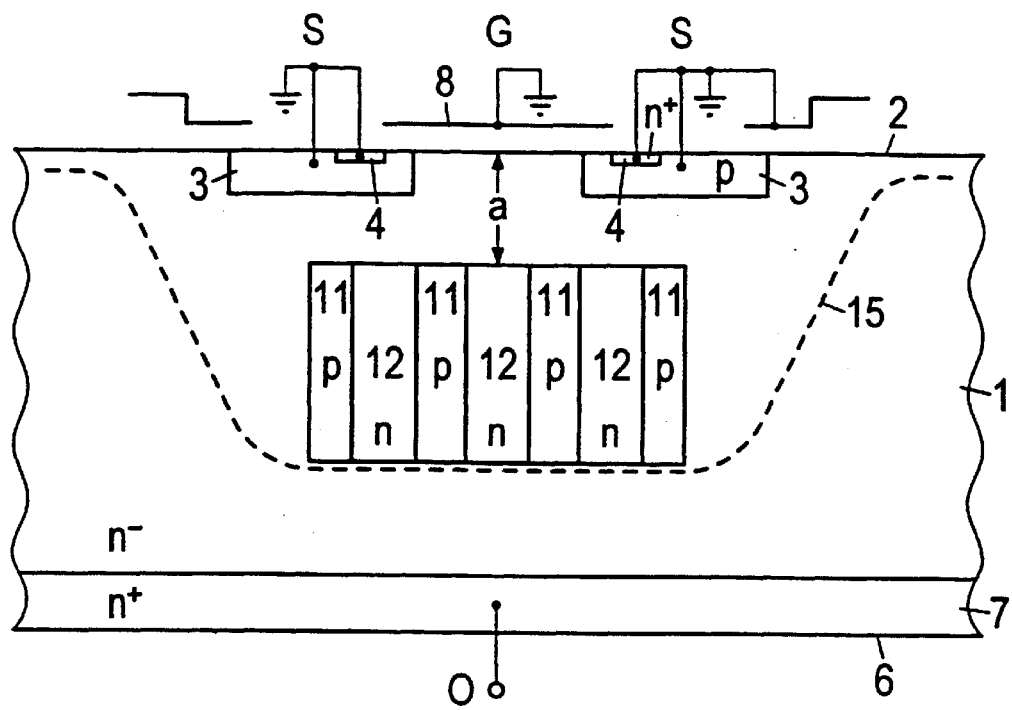
FIG. 1 shows a section through the vertical power MOSFET according to the invention.
Figure 3:
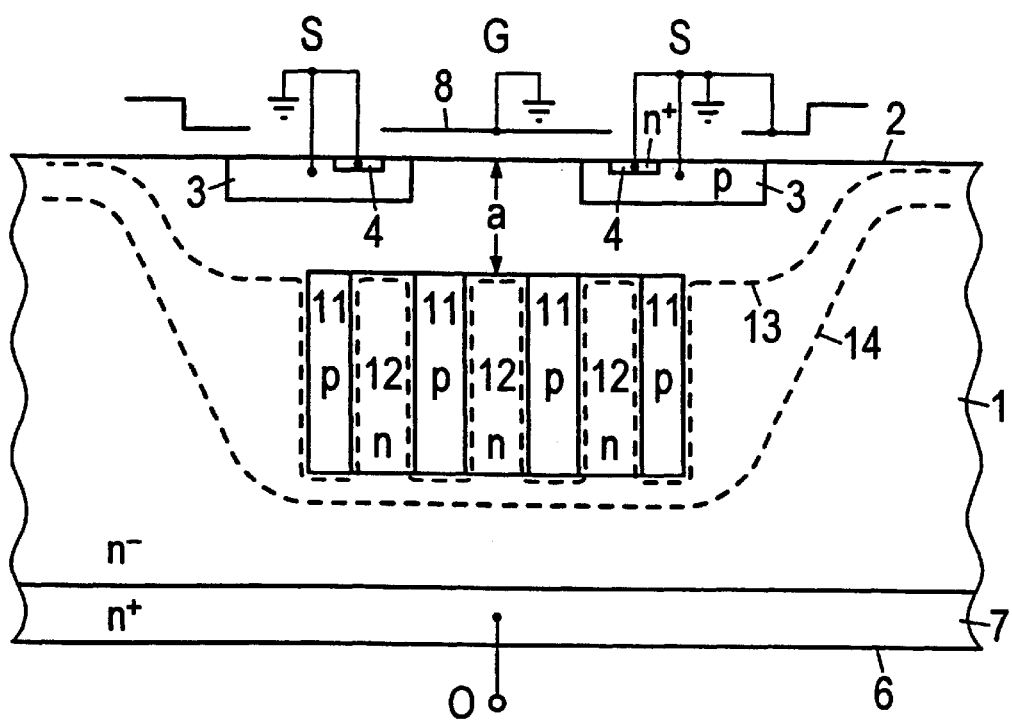
FIG. 3 shows a section through a prior and vertical power MOSFET.

In contrast to the existing vertical MOSFET shown in FIG. 3, in the vertical power MOSFET according to the invention shown in FIG 1, the n conductive zones 11 are doped by means of diffusion with platinum, gold etc. in order to reduce the charge carrier life in these zones. This shortening of the charge carrier life can also be achieved by irradiation with electrons or application of helium. The originally higher doping level means that repercussions on the specific resistance of the MOSFET as a result of the compensating effect of shortening the charge carrier life are prevented.

The shorter charge carrier life achieves more rapid turn off of the current, so that the power MOSFET can receive its reverse voltage sooner.

The thickness dimensions of the additional zones 11, 12 are chosen such that, at full reverse voltage, the space charge zone does not reach the "rear" $n^+/n^-$ junction between the inner zone 1 and the rain zone 7 under any circumstances and, in practice, ends at the junction between the additional zones 11, 12 and the inner zone 1.

The maximum extent of the space charge zone is indicated in FIG. 1 by a line 15.

Figure 2A:
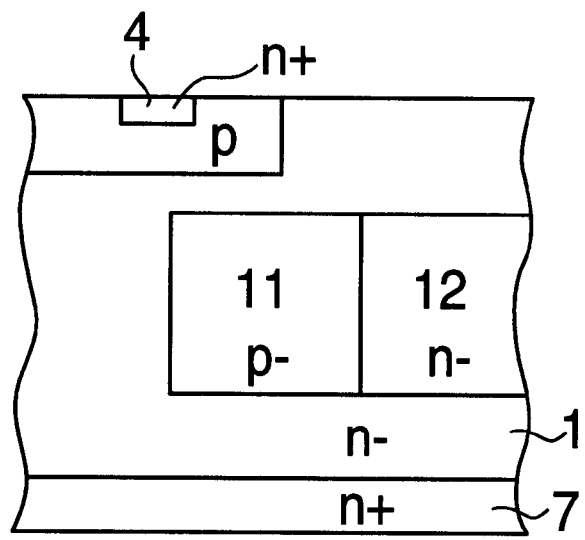
FIGS. 2A and 2B show schematic illustrations for explaining the production of the power mosfet.
Figure 2B:
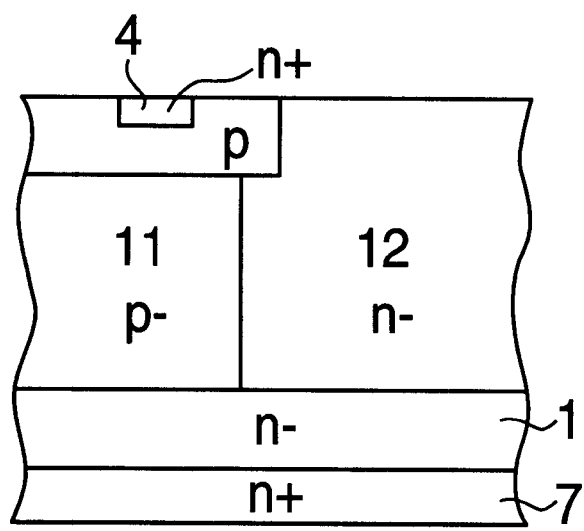

The polarities indicated in FIGS. 1 and 2 can, of course, be interchanged. Thus, for example, the inner zone 1 can be p doped the zones 11 are n doped and the zones 12, like the inner zone 1, are p doped. Furthermore, it is also possible to provide only one n-conductive zone 11 ("column") in a p-conductive inner zone 1 or only one p-conductive zone 11 in an n-conductive inner zone 1.

the various zones 11 and 12 can be buried in epitaxial layers as shown in FIG. 2A or as vertical columns as shown in FIG. 2A, the variant found to be especially advantageous.

What is claimed is:

1. Vertical power MOSFET having a semiconductor body with an inner zone (1) of the first conduction type and a predetermined doping concentration in which in operation is formed a space charge zone, at least one base zone (3), adjoining the inner zone (1) and a first surface of the semiconductor body, of the second conduction type and into which in each case at least one source zone (4) is embedded, at least one drain zone (7), adjoining one of the surfaces of the semiconductor body, and with at least one additional zone (11) of the second conduction type arranged in the inner zone (1) essentially inside the space charge zone which spreads out when there is a reverse voltage, and at least one additional zone (12) of the first conduction type, which is laterally surrounded by said at least one additional zone of the second conduction type, is more highly doped than the inner zone (1), and has a doping level for the additional zones (11, 12) and distances between the additional zones of the second conduction type such that their charge carriers are substantially depleted when a reverse voltage is applied, characterized in that the charge carrier lifetime in the at least one additional zone (12) of the first conduction type has been reduced by at least one of a lifetime reducing impurity or irradiation and the thickness dimensions and doping of the additional zones (11, 12) are such that the space charge zone that spreads out when any operating reverse voltage less than that necessary to cause avalanche breakdown is applied, does not reach the drain zone (7) but leaves the majority of the inner zone (1) located between the bottom of the additional zones (11, 12) and the drain zone (7) free of the space charge zone.

2. The vertical power MOSFET of claim 1 designed for a reverse voltage of 400V in which the thickness of an additional zone is less than 10 microns.

3. The vertical power MOSFET of 1 characterized in that the charge carrier life is set to values below 0.5 $\mu$s.

4. A vertical power MOSFET having a semiconductive body with top and bottom surfaces and comprising:

at least one source zone of a first conduction type and of relatively low resistivity at the top surface;

a base zone of the second conduction type surrounding said source zone of the first conduction type;

a drain zone of the first conduction type and of relatively low resistivity at the bottom surface;

an inner portion of the first conduction type and of relatively high resistivity between the base zone and the drain zone;

at least one additional zone of the first conduction type and at least one additional zone of the second conduction type each in the inner portion; and separate electrode connections to the source and drain zones;

characterized in that the charge carrier lifetime in the at least one additional zone of the first conduction type has been reduced by at least one of a lifetime reducing impurity or irradiation and the doping concentration in each additional zone of the first conduction type is at least an order of magnitude larger than that of the inner zone of the first conduction type; the doping level for the additional zones and distances between the additional zones of the second conduction type are such that their charge carriers are substantially depleted when a reverse voltage is applied; and the thicknesses of the additional zones are sufficient that when any reverse operating voltage less than that necessary to cause avalanche breakdown is applied between the source and the drain electrodes the space charge layer created by the reverse voltage never reaches the drain zone, but leaves the majority of the inner zone located between the bottom of the additional zones and the drain zone free of the space charge zone.

5. The vertical power MOSFET of claim 4 in which the additional zones are formed in an epitaxial material of lower resistivity than that of the additional zones.

6. The vertical power MOSFET of 4 characterized in that the charge carrier life is set to values below 0.5 $\mu$s.

* * * * *

UNITED STATES PATENT AND TRADEMARK OFFICE
CERTIFICATE OF CORRECTION

PATENT NO. : 6,479,876 B1
DATED : November 12, 2002
INVENTOR(S) : Gerald Deboy et al.

It is certified that error appears in the above-identified patent and that said Letters Patent is hereby corrected as shown below:

<u>Title page,</u>
Insert -- [73] Assignee: Infineon Technologies AG, Munchen, Germany --.

Signed and Sealed this

Third Day of June, 2003

JAMES E. ROGAN
*Director of the United States Patent and Trademark Office*